United States Patent
Sakaue et al.

(10) Patent No.: US 8,274,300 B2
(45) Date of Patent: Sep. 25, 2012

(54) THERMAL CONTROL UNIT FOR SEMICONDUCTOR TESTING

(75) Inventors: Naoto Sakaue, Hadano (JP); Fook Seng Kong, Singapore (SG)

(73) Assignee: KES Systems & Service (1993) Pte Ltd., Singapore (SG)

( * ) Notice: Subject to any disclaimer, the term of this patent is extended or adjusted under 35 U.S.C. 154(b) by 793 days.

(21) Appl. No.: 12/321,003

(22) Filed: Jan. 14, 2009

(65) Prior Publication Data

US 2009/0183866 A1  Jul. 23, 2009

Related U.S. Application Data

(60) Provisional application No. 61/011,563, filed on Jan. 18, 2008.

(51) Int. Cl.
*G01R 31/00* (2006.01)

(52) U.S. Cl. ......... 324/750.03; 324/750.06; 324/750.08; 165/247; 165/287

(58) Field of Classification Search .............. 324/750.03, 324/750.06, 750.08; 165/247, 287
See application file for complete search history.

(56) References Cited

U.S. PATENT DOCUMENTS

| | | | | |
|---|---|---|---|---|
| 5,086,269 A * | 2/1992 | Nobi | ........................ | 324/750.07 |
| 5,349,237 A * | 9/1994 | Sayka et al. | ................... | 257/715 |
| 6,956,390 B1 * | 10/2005 | Feltner et al. | ............ | 324/750.03 |
| 7,086,454 B1 * | 8/2006 | Hsu | .................. | 165/104.26 |
| 7,100,389 B1 * | 9/2006 | Wayburn et al. | ............. | 62/259.2 |
| 7,199,597 B2 | 4/2007 | Tustaniwskyj et al. | | |
| 2002/0163070 A1 * | 11/2002 | Choi | ........................... | 257/692 |
| 2006/0001435 A1 * | 1/2006 | Teneketges | ................... | 324/754 |
| 2006/0032627 A1 * | 2/2006 | Nakamura et al. | ............ | 165/287 |
| 2006/0238188 A1 * | 10/2006 | Naitou et al. | ............... | 324/158.1 |
| 2007/0240872 A1 * | 10/2007 | Hayashi et al. | ................ | 165/254 |

* cited by examiner

*Primary Examiner* — Arleen M Vazquez
(74) *Attorney, Agent, or Firm* — Lerner, David, Littenberg, Krumholz & Mentlik, LLP

(57) ABSTRACT

A thermal control unit with a heat pipe that conducts heat away from a device under test during burn-in. The heat pipe has a heater that allows control of the rate at which heat is transferred from the DUT to the heat pipe. A sensor and controller are provided to control the heat in response to the measured temperature of the DUT. The sensor and controller control the heater to maintain the surface temperature of the DUT within a specified range.

23 Claims, 15 Drawing Sheets

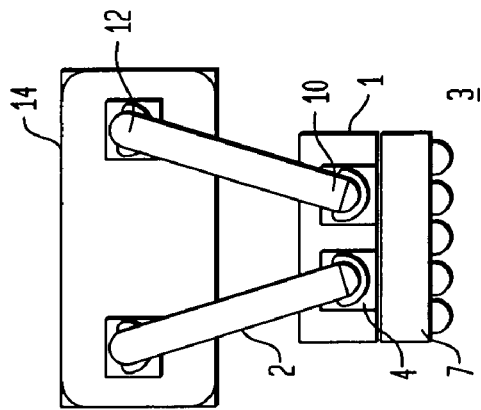
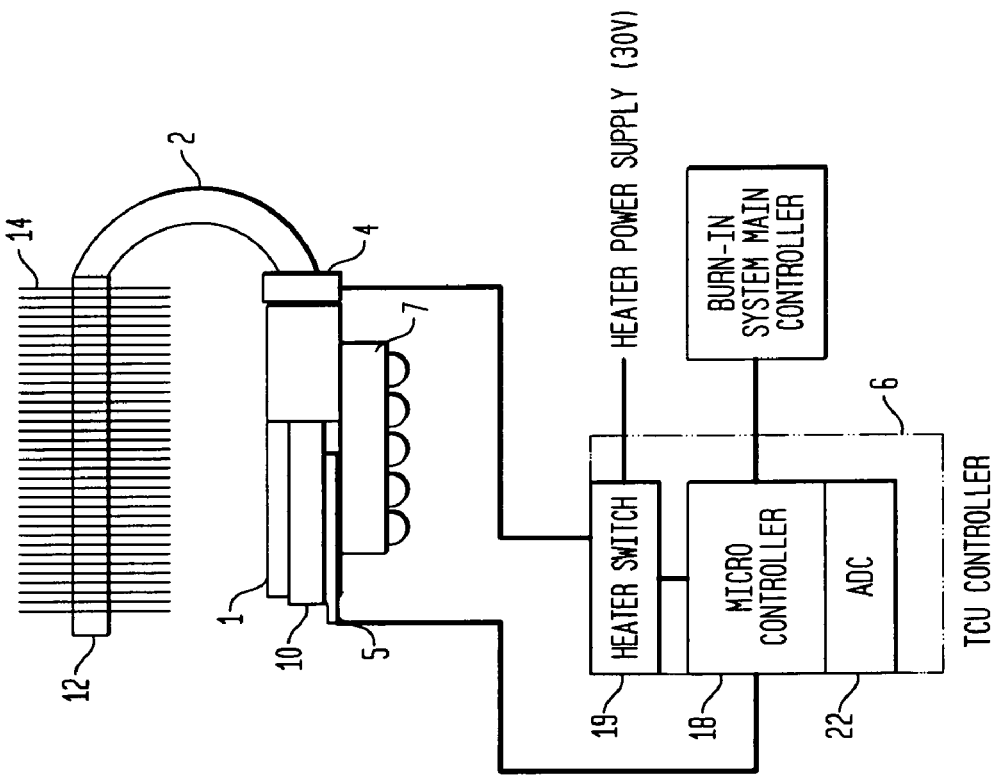

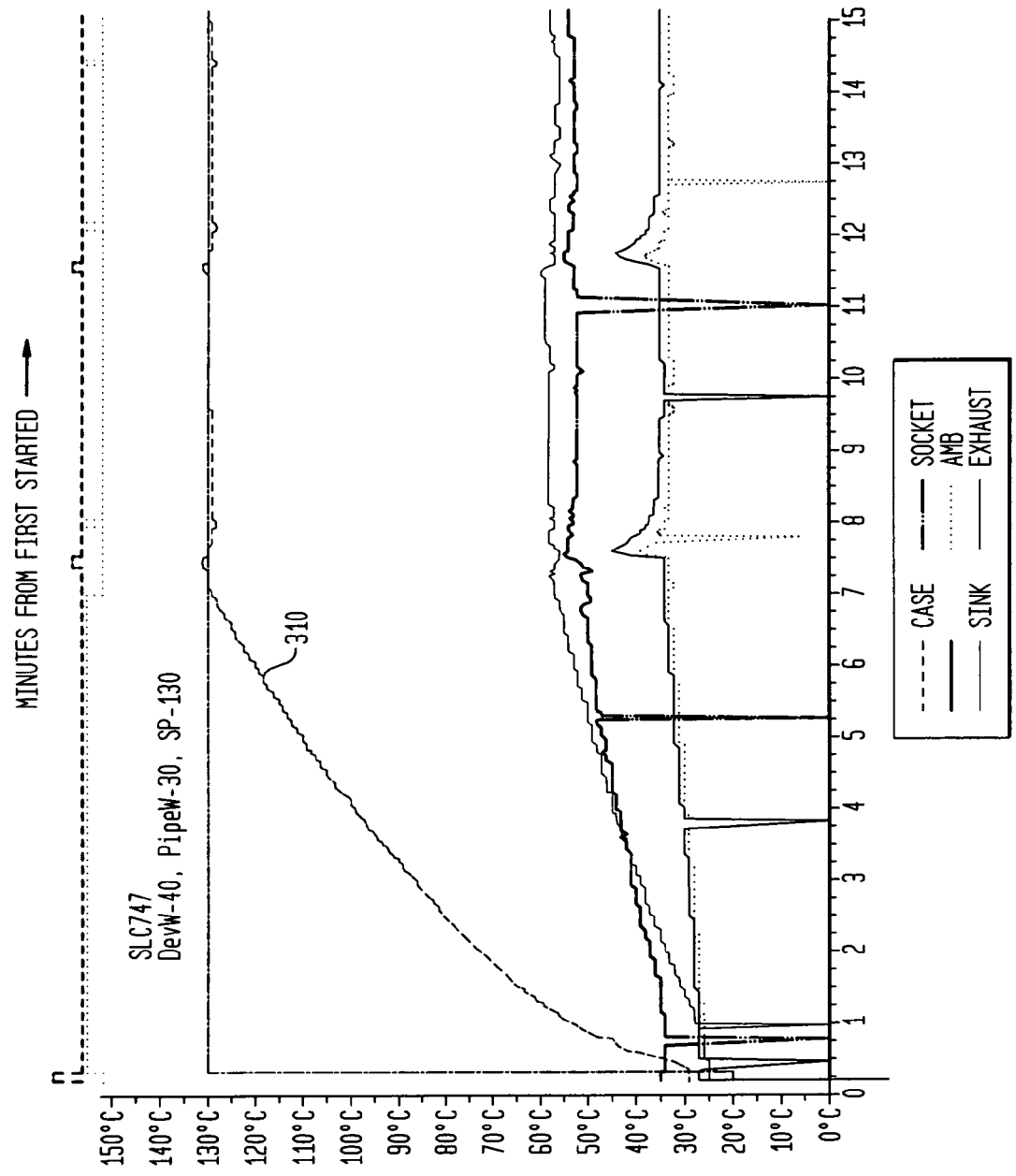

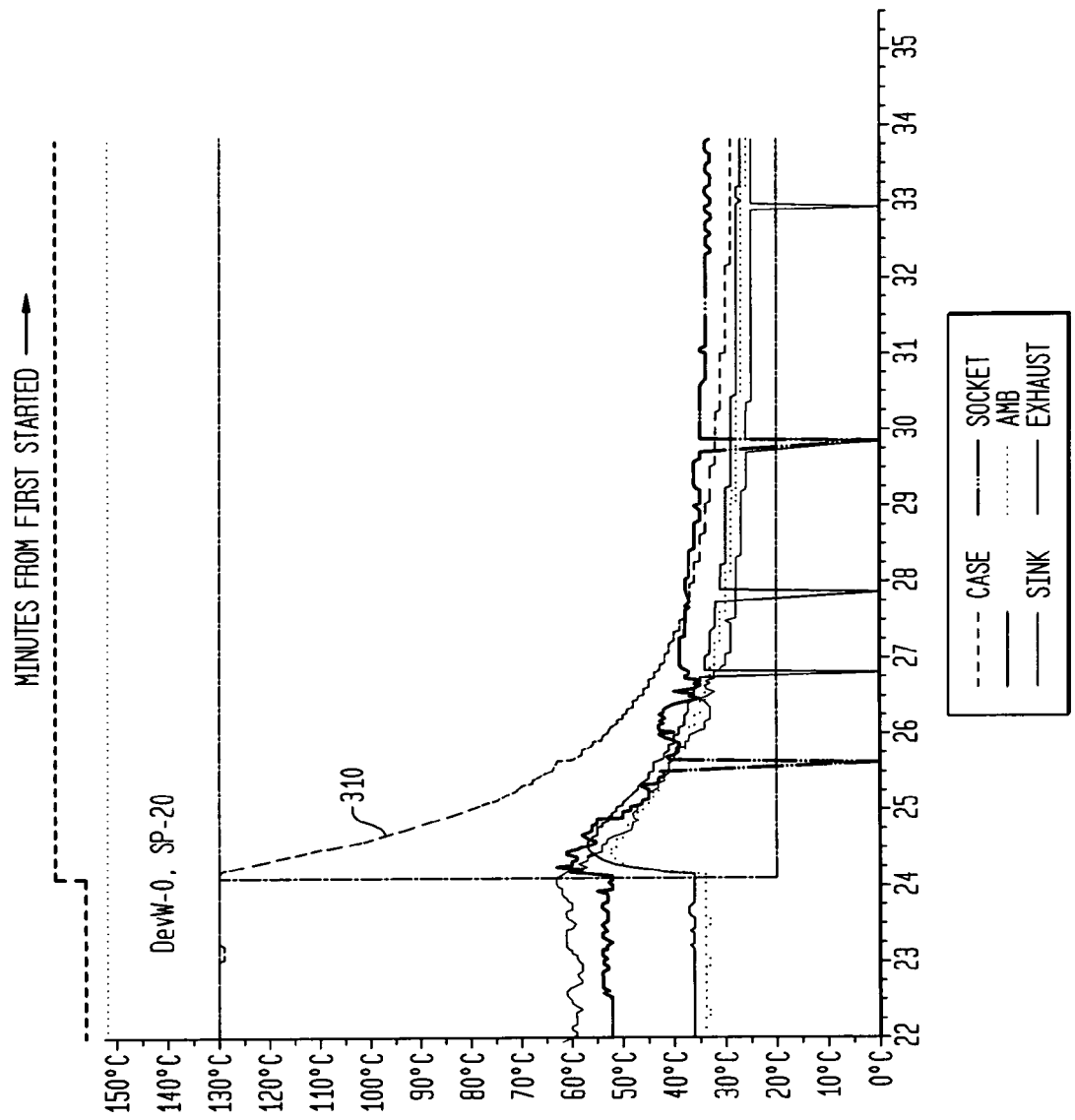

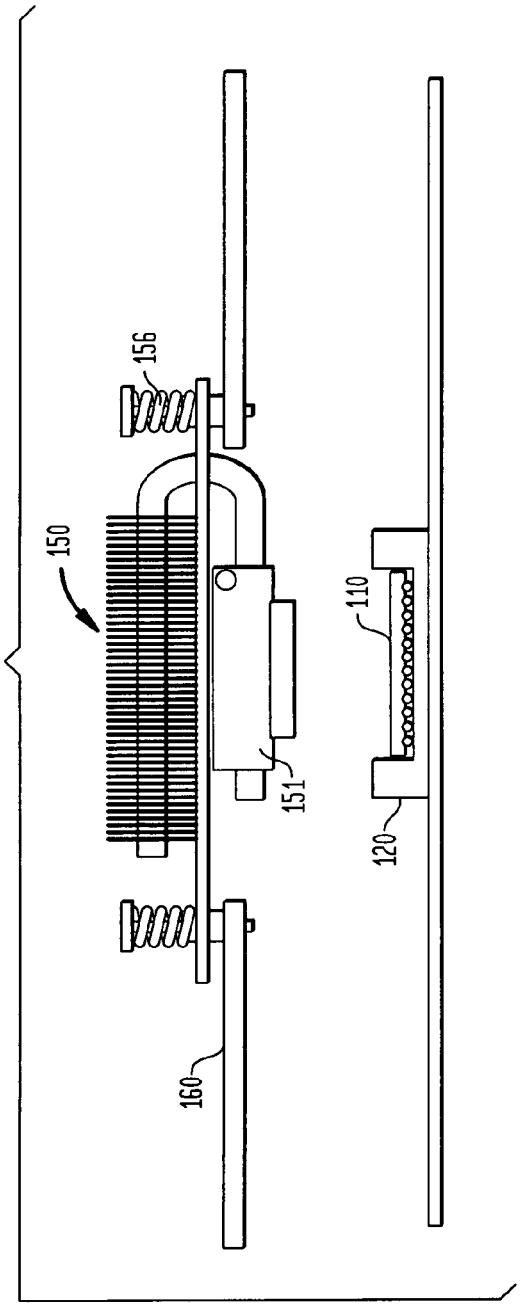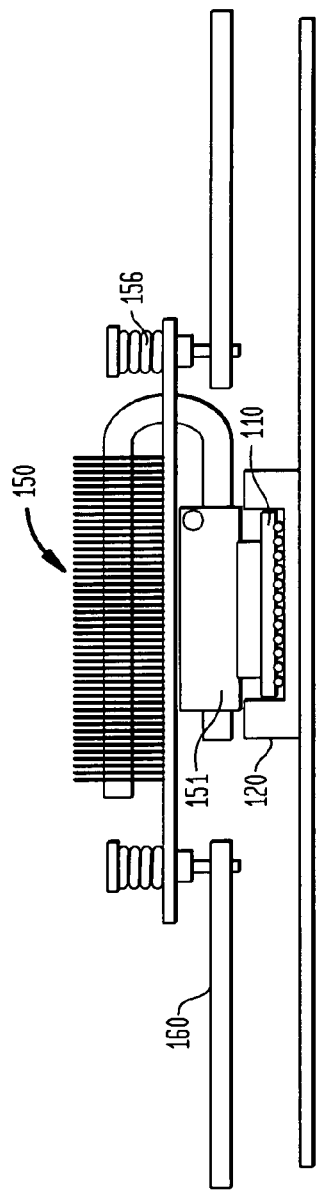

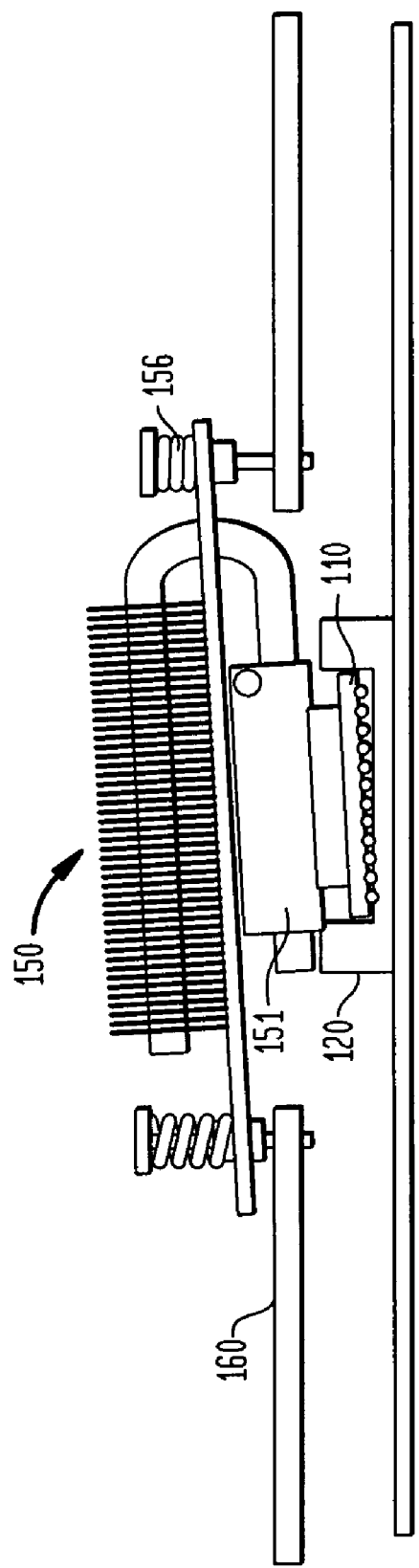

THERMAL CONTROL UNIT FOR SEMICONDUCTOR TESTING

CROSS REFERENCE TO RELATED APPLICATIONS

This application claims the benefit of the filing date of U.S. Provisional Patent Application No. 61/011,563 filed Jan. 18, 2008, the disclosure of which is hereby incorporated herein by reference.

FIELD OF THE INVENTION

The present invention is directed to an apparatus and method for controlling the temperature of an integrated circuit during the test and burn-in process.

BACKGROUND OF THE INVENTION

Semiconductor devices, i.e., integrated circuits, are tested after packaging to identify those devices that are likely to fail shortly after being put into use. This test is described as a burn-in test. The burn-in test thermally and electrically stresses the semiconductor devices to accelerate the failure of those devices that would otherwise fail early on. This ensures that the devices sold to customers are more reliable.

The burn-in test can take many hours to perform and the temperature of the semiconductor devices is held in the range of about 100° C. to about 140° C. during those tests. During the burn-in test, the semiconductor devices are also subjected to ten percent (10%) to thirty percent (30%) higher than normal voltage. Consequently, since the power dissipation during burn-in is significantly higher than under normal operation, the extra power dissipation makes it even more difficult to control the temperature of the semiconductor device during burn-in. Although it is desirable to keep the temperature of the semiconductor device as high as possible during the burn-in in order to minimize the amount of time required for this test, the temperature must not be so high as to damage the semiconductor devices that are otherwise acceptable.

The latest semiconductor devices, especially microprocessors, have even higher electrical consumption in accordance with their higher frequency of operation. The higher electrical consumption causes the semiconductor devices to generate heat over 100 watts. In the burn-in of these devices, the heat generated when these devices are continuously connected with electricity at constant high temperature (e.g., about 125° C.) can be catastrophic. Unless these heat generating semiconductor devices are appropriately cooled to a controlled temperature, the burn-in testing equipment itself might be destroyed in addition to the semiconductor devices under test (DUTs).

One example of a prior art thermal control unit (TCU) for burn-in is illustrated in FIG. 3. Packaged semiconductor device 7 is attached to finned heat sink 9. Heater 8 is inserted between packaged semiconductor device 7 and heat sink 9. The heat generated by packaged semiconductor device 7 transfers to heat sink 9, where it is then dissipated. During the burn-in process, the temperature of the semiconductor device surface needs to be maintained within a desired temperature range (e.g., 100° C.±3°). The TCU has controller 11 to heat the device as required for maintaining the temperature of the packaged semiconductor device 7 within this range, while air is continuously circulated past fins 3.

In order to obtain the desired temperature range as illustrated in FIG. 3, temperature sensor 10 monitors the surface of the semiconductor device 7. If the measured temperature is lower than a certain specified temperature, controller 11 turns on heater 8 to heat the semiconductor device 7. As heater 8 warms up, the surface of semiconductor device 7 is directly heated to raise the temperature of the semiconductor device 7. On the other hand, when the temperature starts to exceed the upper limits of the prescribed range, heater 8 is turned off and the semiconductor surface is cooled by conducting heat away from the semiconductor device using heat sink 9. By repeatedly turning on and off the heater, the temperature of the semiconductor device surface can be maintained within the desired temperature range.

Another prior art configuration is illustrated in FIG. 4. This configuration also uses a finned heat exchanger 9 to cool the device, which is heated using heater 8. In this embodiment, the finned heat exchanger 9 is coupled to a source for circulating air to carry heat away from the heat sink 9. A fan 25 is provided to cool the finned heat exchanger 9. The greater the air flow, the greater the amount of cooling provided by the air flowing past the heat exchanger (at a given temperature). While not capable of fine temperature control, this configuration provides greater cooling capacity than a similar configuration with no air flow control capability.

Although the above-described temperature controllers utilize a finned heat sink cooled by air flowing past the fins, other prior art systems such as the one described in U.S. Pat. No. 7,199,597 use a liquid cooled heat exchanger. Another example of a TCU that uses liquid coolant for the heat exchanger used to cool a semiconductor device during burn-in is illustrated in FIG. 5. Semiconductor device 7 is attached to cooling cavity 420 with heater 480 being inserted between semiconductor device 7 and cooling cavity 420. Heat generated by the semiconductor device 7 is transmitted to cooling cavity 420 where it is absorbed by the cooling liquid running through cooling cavity 420. The cooling liquid enters from port 430 into the cooling cavity 420 and the temperature of the cooling liquid increases as it conducts heat away from semiconductor 7. The heated liquid exits cooling cavity 420 through port 440. This conducts heat away from the semiconductor device 7.

Accordingly, improved thermal controllers for monitoring the temperature of a device under test within a prescribed range are sought.

SUMMARY OF THE INVENTION

The thermal control unit (TCU) described herein has integrated components that conduct heat away from the semiconductor device during the burn-in process in a controlled and adaptive manner. In one embodiment the integrated components include a liquid-containing heat transfer device commonly referred to as a heat pipe. The heat pipe is equipped with a heater that is used to control the rate at which heat is conducted away from the semiconductor device. The heater is controlled by a thermal regulator that senses the temperature of the semiconductor device under test. When the temperature of the semiconductor device is sensed to be at or above a predetermined threshold temperature, the heater is off and the heat pipe conducts heat away from the semiconductor at the maximum rate. If the temperature of the semiconductor device falls below a certain threshold, the rate of heat transfer from the semiconductor device to the heat pipe is reduced by activating the heater. In one embodiment the heater heats the surface of the heat pipe which reduces the rate at which the heat pipe conducts heat away from the semiconductor device.

In an illustrative embodiment, the heat pipe contains liquid that circulates in the heat pipe according to well-understood principles for heat pipe type heat exchangers. That is, the cooling liquid resides at one end of the heat pipe that is placed adjacent to the semiconductor device. As heat is absorbed by the heat pipe from the semiconductor device, the liquid vaporizes and rises to the other end of the heat pipe where it is cooled. Cooling is accomplished by standard mechanisms such as directing cooling air past the heat pipe, or using cooling fins that radiate heat away from the heat pipe. Cooling fins are well known to one skilled in the art and not described in detail herein. Regardless of the mechanism, the vapor condenses as a result of the cooling, and the water travels down to the reservoir of liquid at the end of the heat pipe that is adjacent to the semiconductor device.

The liquid used in the heat pipe is largely a matter of design choice. Although water is commonly used, other inert liquids (e.g., ethylene glycol) are contemplated as suitable.

In one embodiment, the interior of the heat pipe is constructed such that the liquid path from the end of the heat pipe where condensation occurs to the other end of the heat pipe where the reservoir of liquid resides is along the wall of the heat pipe. This is accomplished by providing passages along the heat pipe wall for channeling the condensed vapor along the walls of the heat pipe.

In this embodiment, the heater is constructed as a jacket around the exterior wall of the heat pipe. If the controller determines that the temperature of the semiconductor device is at or below a certain threshold, and therefore the rate of cooling is to be slowed, the sensor will turn the heater on. The heater, when turned on, heats the wall of the heat pipe, and also the temperature of the liquid flowing from the cooling end of the heat pipe down to the bottom. Heating the liquid slows down the rate of heat transfer from the semiconductor device to the heat pipe. For example, the cooled condensate is reheated by the heater, causing it to again vaporize. As such the cooled liquid is not returned to the reservoir to lower the temperature of the remaining liquid. This causes the liquid in the reservoir at the end proximate the semiconductor device to cool more slowly, which slows the rate of heat transfer from the semiconductor device to the heat pipe. This in turn causes the temperature of the semiconductor device to rise until it reaches the predetermined threshold where the heater is again turned off, and heat is conducted away from the semiconductor device by the heat pipe at the maximum rate. The end of the heat pipe adjacent the semiconductor device is embedded in a jacket, which is preferably made of a material that conducts heat. In one embodiment, the heat pipe is embedded in a copper block. In other embodiments, a plurality of heat pipes are embedded in the copper block, which is placed adjacent to the semiconductor device. A sensor is interposed between the heat pipe and the semiconductor device. The sensor is positioned such that it can sense the temperature of the semiconductor device and provide an accurate determination of when the rate of heat transfer from the semiconductor device to the heat pipe needs to be changed.

The heat pipe assembly is provided in a socket that is disposed over the semiconductor device, which is placed on a testing board. In an advantageous embodiment, an array of sockets with integrated heat pipes is provided on a board that is configured to mate with a test board on which an array of semiconductor devices is disposed. When the board with the heat pipe sockets disposed thereon is brought into contact with the test board with the semiconductor devices mounted thereon, the burn-in process for the semiconductor devices is commenced.

BRIEF DESCRIPTION OF THE DRAWINGS

FIG. 1 is a partial cut-away side view of one embodiment of a thermal control unit of the present invention with the control loop illustrated schematically;

FIG. 2 is an end view of the embodiment illustrated in FIG. 1;

FIG. 16A-B illustrates the temperature of a dummy DUT during evaluation according to one embodiment; and FIG. 17A-C is a detail view of how a DUT is brought into contact with a thermal control unit according to one embodiment of the present invention.

DETAILED DESCRIPTION

Figure 3:
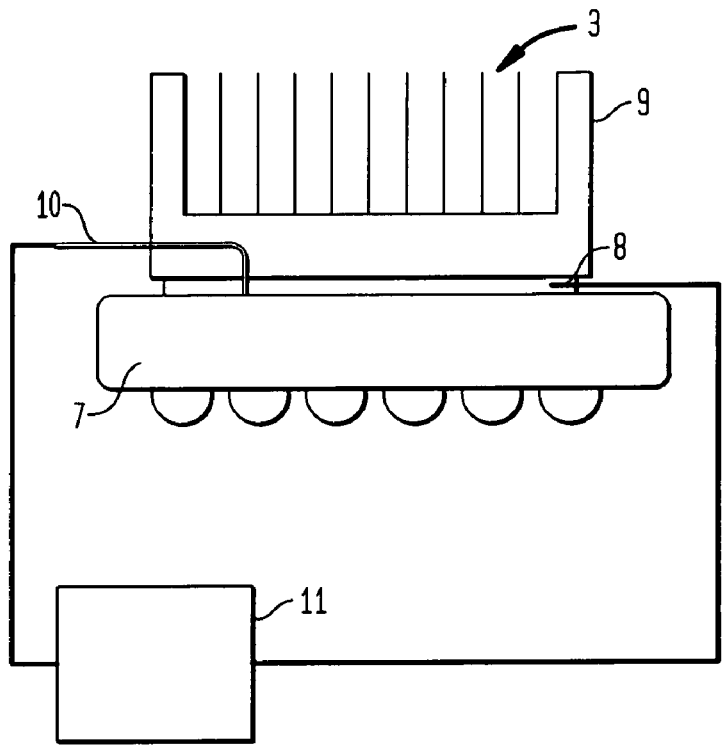
FIG. 3 is a schematic of a prior art thermal control unit in which the heat sink is air-cooled.
Figure 4:
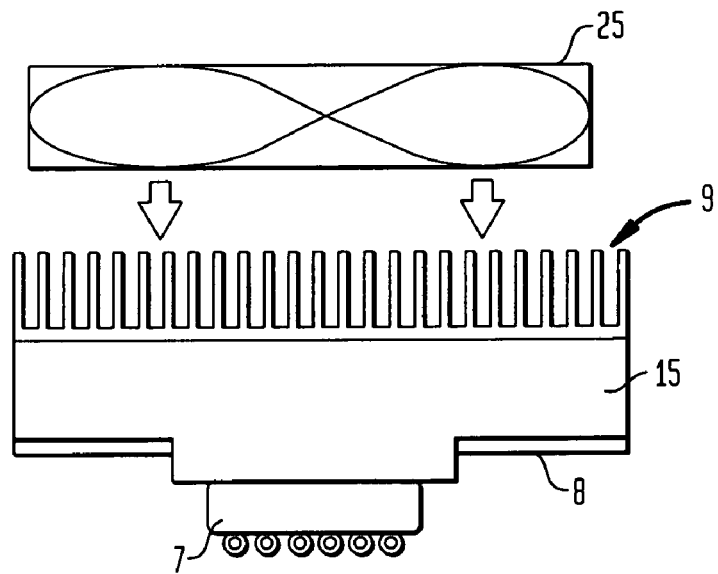
FIG. 4 is an alternative configuration of the prior art thermal control unit illustrated in FIG. 3 with separate heating and cooling paths.
Figure 5:
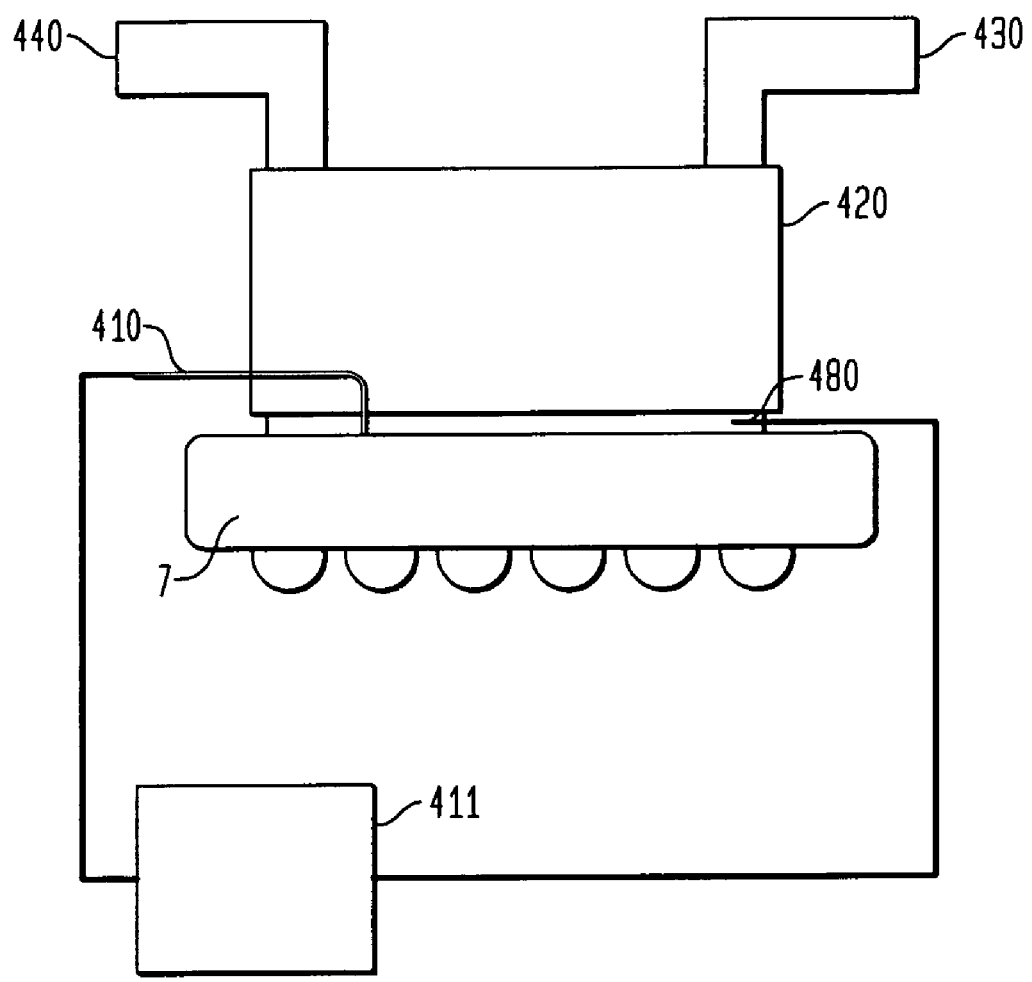
FIG. 5 is a schematic of a prior art system in which the heat sink is cooled by liquid.

FIG. 1 is a schematic diagram of an active thermal control system for regulating the temperature of a device under test (DUT). For purposes of the example embodiment described herein, DUT is an electronic semiconductor circuit device, such as a microprocessor chip. Alternatively, DUT may be any electronic, mechanical or other device being subjected to one or more tests performed under specific temperature settings. DUT 7 is preferably held in close proximity to cooling assembly 3, which is configured to regulate the temperature of DUT 7. In the preferred embodiment, a portion of DUT 7 such as the device surface, contacts cooling assembly 3. In a practical embodiment, cooling assembly 3 is coupled to a compatible carrier (not shown). The carrier and DUT 7 are clamped together during thermal conditioning, testing, and cool down of DUT 7. In response to such clamping, DUT 7 is forced into physical contact with cooling assembly 3. Such clamping ensures that heat is effectively transferred between DUT 7 and cooling assembly 3. Alternatively, DUT 7 may be held against cooling assembly 3 using a vacuum device or any suitable folding mechanism.

The assembly 3 is equipped with a heat pipe 2. Although only a single heat pipe 2 is illustrated in FIG. 1, systems with a plurality of heat pipes are contemplated. Heat pipe 2 has a proximate end 10 and a distal end 12. Proximate end 10 is placed adjacent to DUT 7. Proximate end 10 is embedded in a metal block 1. In one embodiment, metal block 1 is made of copper. Distal end 12 is illustrated with fins 14. Fins 14 facilitate cooling of the liquid inside heat pipe 2. Heat pipes such as the ones contemplated in the present invention are well known. Heat pipes are commercially available from a variety of sources. One source of heat pipes is Auras of Austin, Tex.

Heat pipe 2 is configured such that liquid inside the heat pipe absorbs heat at the proximate end 10. As the liquid in proximate end 10 absorbs heat from the DUT 7, a portion of the liquid in the proximate end 7 evaporates and rises into distal end 12. As a result of cooling at distal end 12, which is facilitated by fins 14, the liquid condenses and travels back down the heat pipe 2 to proximate end 10. In an advantageous embodiment, passages are provided adjacent the interior walls of heat pipe 2. These passages serve as pathways for the condensation to flow from distal end 12 back to proximate end 10. In another embodiment fine copper balls having diameters in the range of about 0.15 mm to about 0.3 mm are coated onto the interior wall of the heat pipe. One skilled in the art is aware of the many available configurations for such passages.

In operation, the heat generated from the surface of the DUT 7 is absorbed by heat conductive block 1 and transferred into heat pipe 2. The heat conductive block is typically a metal that is a good thermal conductor such as, for example, copper or aluminum.

The temperature of the surface of the DUT 7 is monitored by a temperature sensor 5. The temperature sensor 5 conveys the measurement to the controller 6. Controller 6 is illustrated as having a microcontroller 18 coupled to an analog to digital converter 22 and a temperature switch 19. At the lower limit (e.g., 97° C.) of the operating temperature range (e.g., 100° C.±3° C.), the controller 6 will turn on the temperature switch 19 which will activate the heater 4, which is fixed to the wall of heat pipe 2.

The heater 4 heats the wall of heat pipe 4 and, in turn, the condensation flowing from the distal end 12 to the proximate end 10 of the heat pipe 2. The heater causes at least some of this condensate to revaporize, where it returns to the distal end of the heat pipe 12 and/or returns heated liquid to the proximate end 10 of heat pipe 2. This disrupts the cooling cycle of the heat pipe 2 and reduces the rate of heat transfer from the DUT 7 into the heat pipe 2.

As a result, the temperature of the DUT 7 begins to rise. The temperature of the DUT 7 continues to rise until the surface reaches the upper range of the operating range (e.g., 103° C.). When the upper range of the temperature is reached, controller 6, in response to a signal from sensor 5, turns off the heater 4. When the heater 4 is turned off, the condensation resumes normal flow from the distal end 12 of the heat pipe to the proximate end 10. This restores the normal heat transfer rate from the DUT 7 to the heat pipe 2. Controlling the temperature of the DUT 7 in this manner maintains the temperature within the desired range.

The cooling capacity of the heat pipe and the effect of the heater on that cooling capacity is largely a matter of design choice and will depend largely on the amount of heat generated by the DUT. In one example, the DUT dissipates 100 Watts of power. To achieve equilibrium, the heat pipes will be configured to provide 100 Watts of cooling capacity. Under these conditions, the DUT can generate its own heat if, for purposes of the burn in test, it is desired to raise the temperature of the device. For example, if the size of the heater is such that, when on, the cooling capacity of the heat pipes is reduced from 100 watts to 20 Watts, then the DUT will need to dissipate 80 watts of power via another path. This will cause the temperature of the DUT to rise as it is tying to dissipate more heat that is not being conducted away from the DUT as efficiently as through the heat pipe. When the DUT temperature rises to the predetermined threshold, the heater is turned off and the heat pipe resumes conducting heat away from the DUT at the faster rate. This cycle will be repeated if the DUT falls below the threshold temperature. The frequency of these on and off cycles will depend upon how closely the cooling capacity of the heat pipe matches the heat amount of heat generated by the DUT.

Heat pipes such as the ones illustrated herein often contain fine fibers in the interior to provide capillary action for the vapor to flow from the proximate end to the distal end, and for condensation to flow from the distal end 12 to the proximate end 10. While heat pipes with such fibers disposed therein are useful in the present invention, they are not preferred. This is because the flow of the condensation is not diverted to the wall of the heat pipe. Consequently, the heater disposed on the wall of the heat pipe does not heat the condensate as efficiently as configuration that channel condensate to the wall of the heat pipe.

It is advantageous in the present invention for the heat pipe 2 to have either lines or fine grooves in the inner surface of the heat pipe wall. Alternatively, inorganic fine powder is affixed to the inner wall of the heat pipe 2. Such structures along the inner wall of the heat pipe cause the condensation to flow along the inner wall of the heat pipe. This allows for the more efficient transfer of heat from the heater 4 into the liquid flowing from the distal end 12 to the proximate end 10 of the heat pipe 2. This allows for more efficient operation of the heater. Also, this allows the heater to impact the heat transfer rate from the semiconductor device 7 into the heat pipe 2 more quickly, making the device more responsive.

FIG. 2 is a side view of system 3 illustrated in FIG. 1. FIG. 2 illustrates two heat pipes 2. The distal end of the heat pipes 2 are seen entering cooling fin 14. Cooling fins are also made of a good thermally conductive material. Examples of such materials include aluminum and copper. The proximate ends of heat pipe 2 are seen entering metal block 1. Metal block 1 sits atop semiconductor device 7.

Figure 6:
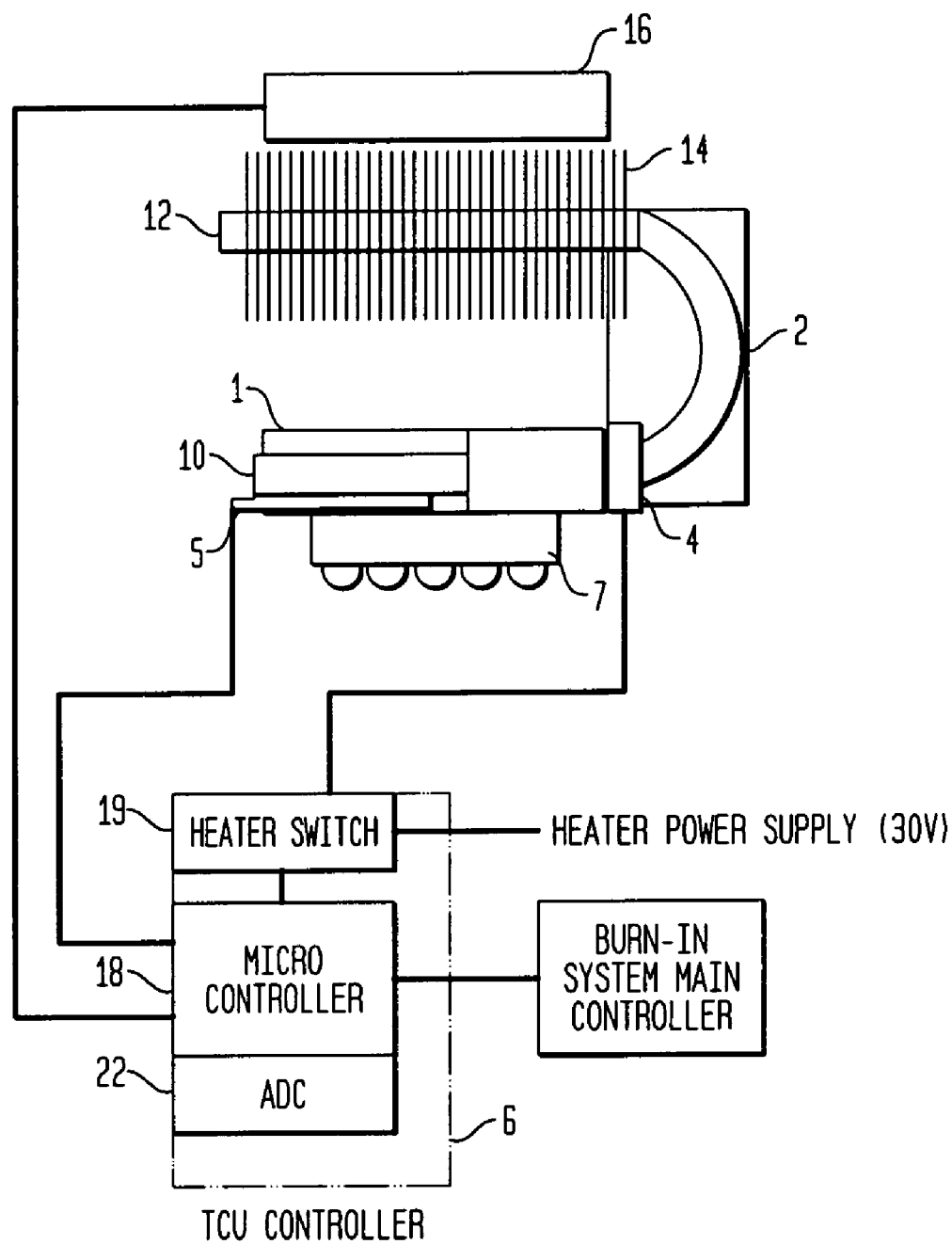
FIG. 6 is a cut away view of an alternate configuration of the thermal control unit illustrated in FIG. 1.

Another embodiment of the present invention is illustrated in FIG. 6. This embodiment is identical to the embodiment illustrated in FIG. 1 with the addition of cooling fan 16. Cooling fan 16, in cooperation with fins 14, cool the vapor rising from the proximate end of the heat pipe 2. This causes the vapor to condense more quickly at the distal end 12, which increases the rate at which the heat pipe 2 draws heat away from semiconductor device 7.

The cooling fan 16 provides additional capacity to control the rate at which the semiconductor device is cooled. This is accomplished by adjusting the speed of the fan, which affects the rate at which heat is radiated from heat pipe 2 through fins 14.

Figure 7:
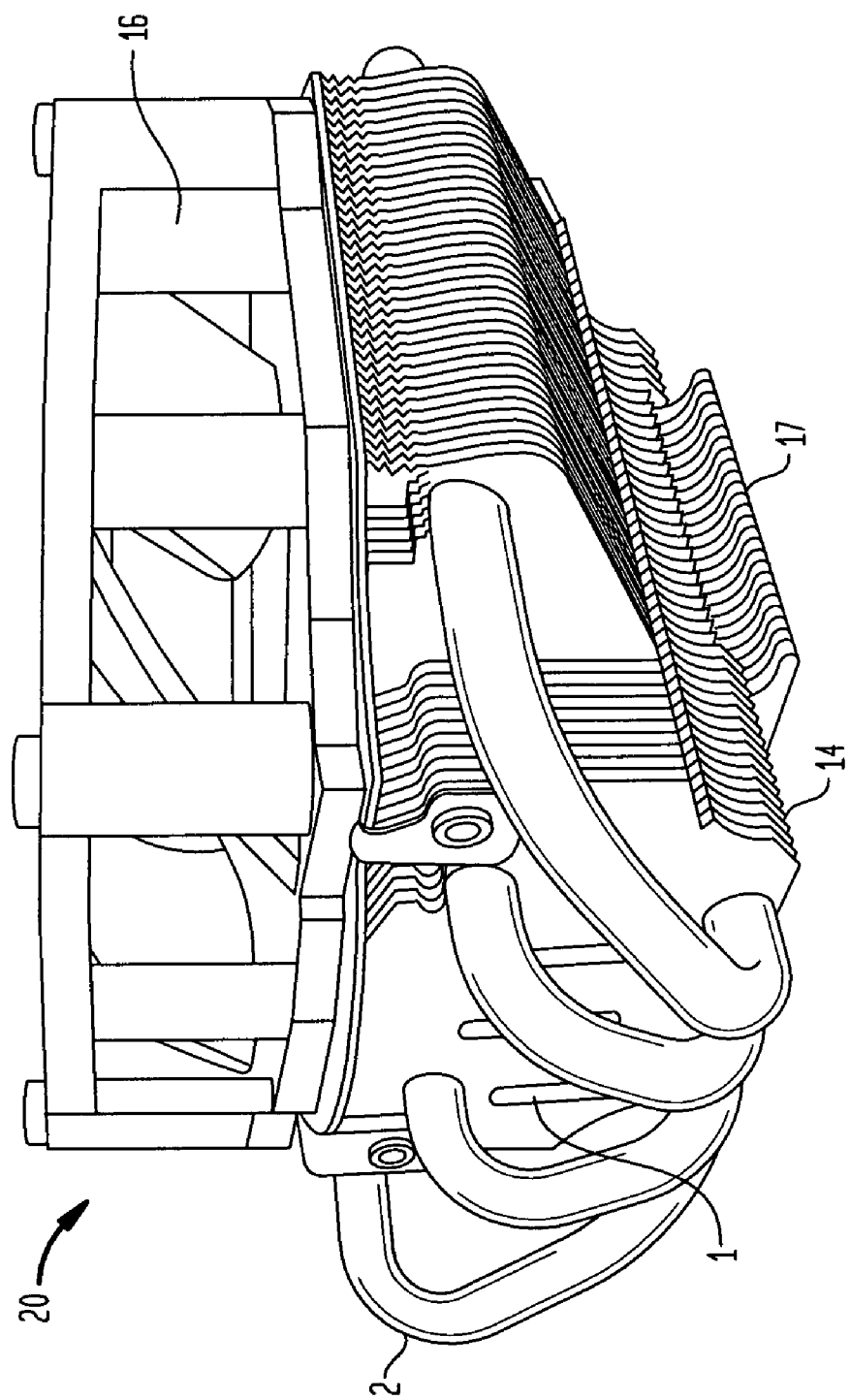
FIG. 7 is a perspective view of a heat pipe assembly.

FIG. 7 provides a perspective view of the thermal control portion 20 of a TCU in which four heat pipe tubes 2 are disposed in copper block 1. The heat pipes 2 have fins 14 that facilitate the removal of the heat from the heat pipe 2. The heat pipe is coupled to a heat sink 17 that is in contact with the DUT (not shown).

Figure 8:
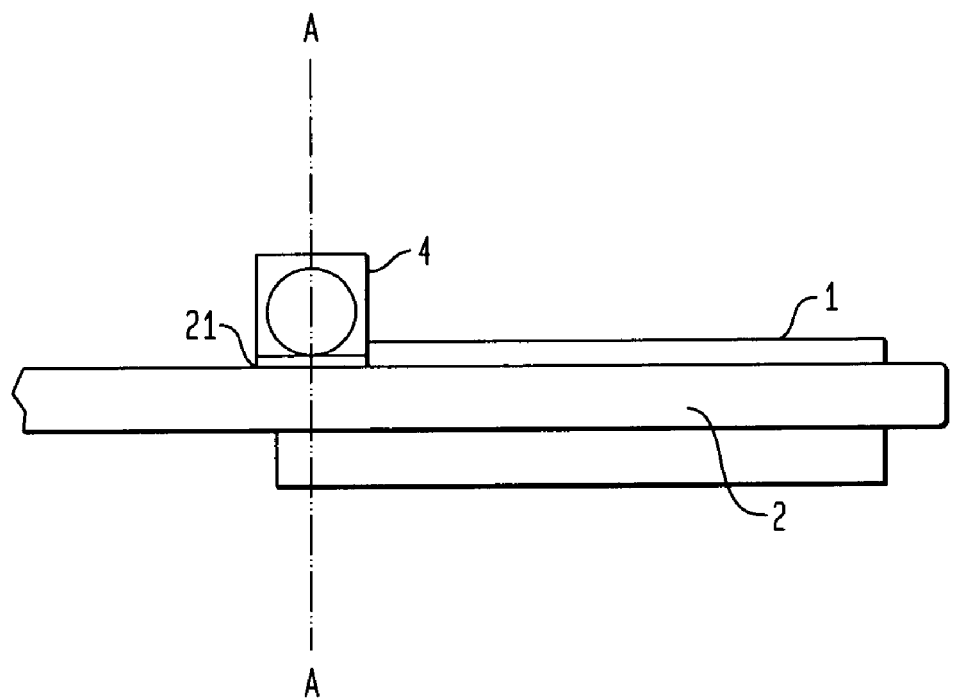
FIG. 8 is a cut away side detail view of the heat pipe/heat sink assembly according to one embodiment.

FIG. 8 is a cross section side view showing a heat pipe 2 disposed in copper block 1. The heat pipe 2 has a heater 4 adjacent thereto. The heat pipe is used to control the rate at which heat is conducted away from the device under test. While the heater 4 is illustrated as also adjacent to copper block 1, the heater is connected to the heat pipe to achieve the desired response, which is to control the rate at which the heat pipe conducts heat away from the DUT. A graphite seat 21 is provided ensure good thermal contact between the heater 4 and the heat pipe 2.

Figure 9:
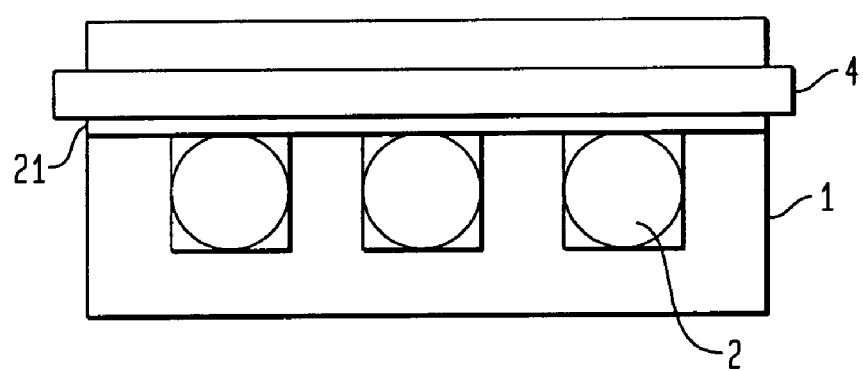
FIG. 9 is a cross section of a heat sink with three heat pipes embedded therein according to one embodiment of the present invention.

FIG. 9 is a cross section of the copper block 1 in FIG. 8 along line A-A thereof. The cross section illustrates 3 heat pipes 2 embedded in copper block 1. Placed above the heat pipes 2 is the graphite seat 21. The heater is placed on the graphite seat 21. The heat from the heater 4 is distributed to the heat pipes by the graphite seat 21.

In the illustrated embodiments, a heater in addition to the heat pipe for directly heating the DUT is not specifically illustrated. Although a heater may be provided to actually heat the semiconductor device 7 in order to maintain the semiconductor device 7 within the desired temperature range, when the DUT is a microprocessor that operates under high frequency, heating the device will not likely be required because of the high power consumption of the device. Such devices generate enough heat to keep them sufficiently warm during the burn-in process. Such devices typically only require cooling to ensure that the temperature of the device does not exceed the specified temperature range during the burn-in process.

Figure 10:
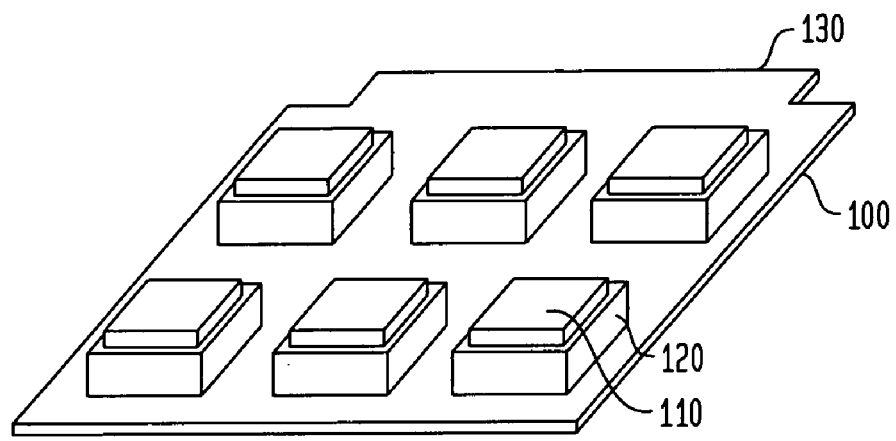
FIG. 10 illustrates a plurality of DUTs mounted on a multilayer printed circuit board (PCB)

The operation of a burn-in process using the TCU of the present invention is described with reference to FIGS. 10-15. FIG. 10 illustrates a conventional burn-in board 100. The conventional burn-in board has a plurality of DUTs 110 mounted on sockets 120. The burn-in board 100 is equipped with an edge connector 130. Traces (not shown) on the circuit board 100 electrically interconnect the sockets 120 with the edge connector 130. Edge connector 130 provides electrical interconnection between the burn-in board 100 and the controller for the burn-in test (not shown).

Figure 11:
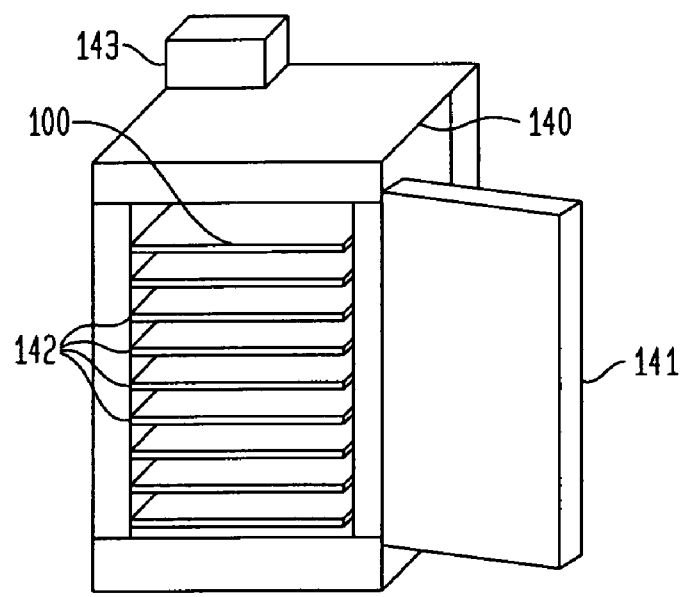
FIG. 11 is a perspective view of a conventional burn-in chamber.

FIG. 11 illustrates a conventional burn-in chamber 140. The chamber 140 has a door 141 through which burn-in boards 100 are loaded and removed. Chamber 140 has slots 142 that receive the burn-in boards 100. Chamber 140 also has a blower and heater assembly 143 to provide the desired heated environment for testing the DUTs (not shown) mounted on burn-in boards 100.

Figure 12:
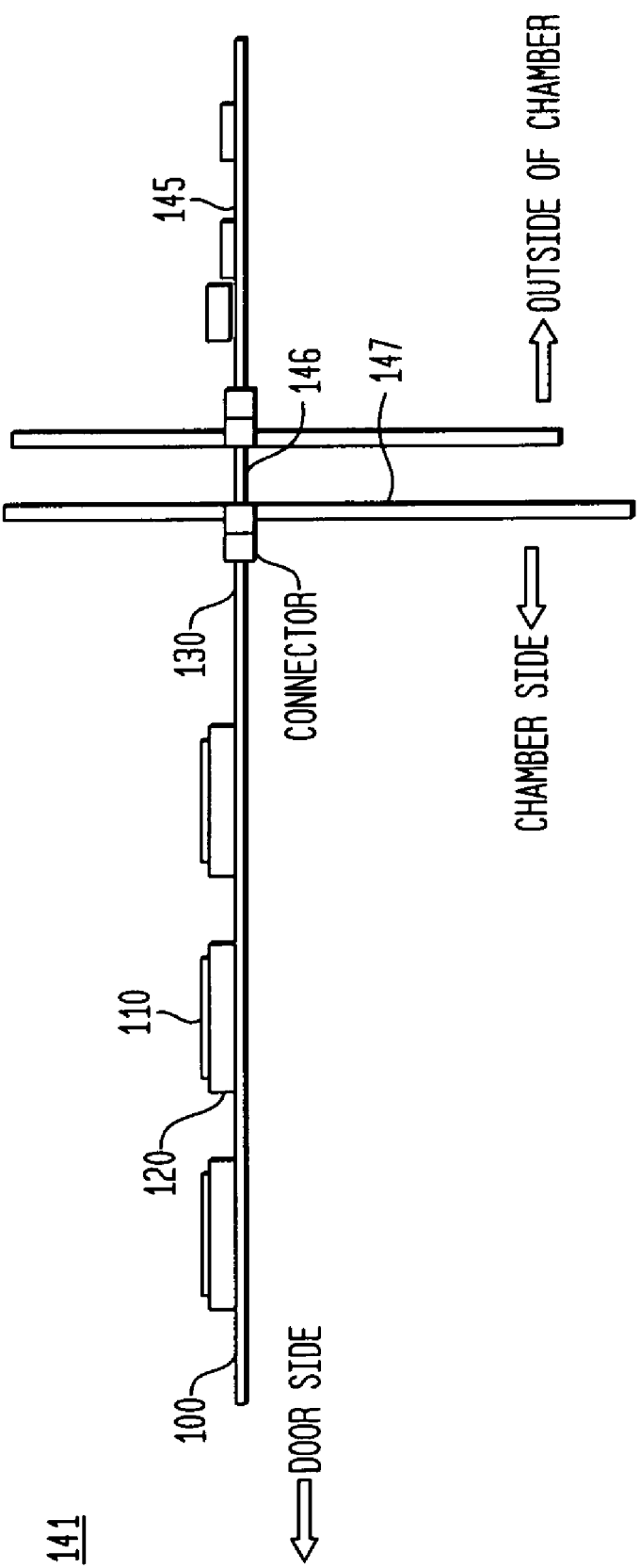
FIG. 12 is a schematic side view of the burn-in chamber of FIG. 11.

FIG. 12 illustrates the interior of the chamber 140, with door 141 side and back plane 147 side. DUTs 110 are mounted on sockets 120 connected to the burn-in board 100. The connector 130 is connected to the test module 145 through a feed through card 146 connected through the back plane 147 of the chamber 140. The test module 145 controls the electrical and environmental conditions for the burn-in test and records the results of the tests. The functions of the test module 145 are well known to one skilled in the art and not described in detail herein.

In one example, the temperature inside the chamber 140 is increased to 125° C. The high temperature places stress on the devices and causes vulnerable devices to fail. Vulnerable devices are those devices that have a fault that is not detectable unless exposed to conditions that place stress on the device. These stresses are typically high temperature and/or electrical stress. Devices that would have an unacceptable lifetime when put into use or otherwise fail prematurely are thereby detected. Detecting these devices provides the ability to ensure that devices that are likely to fail prematurely are not sold or otherwise put into service.

Figure 13:
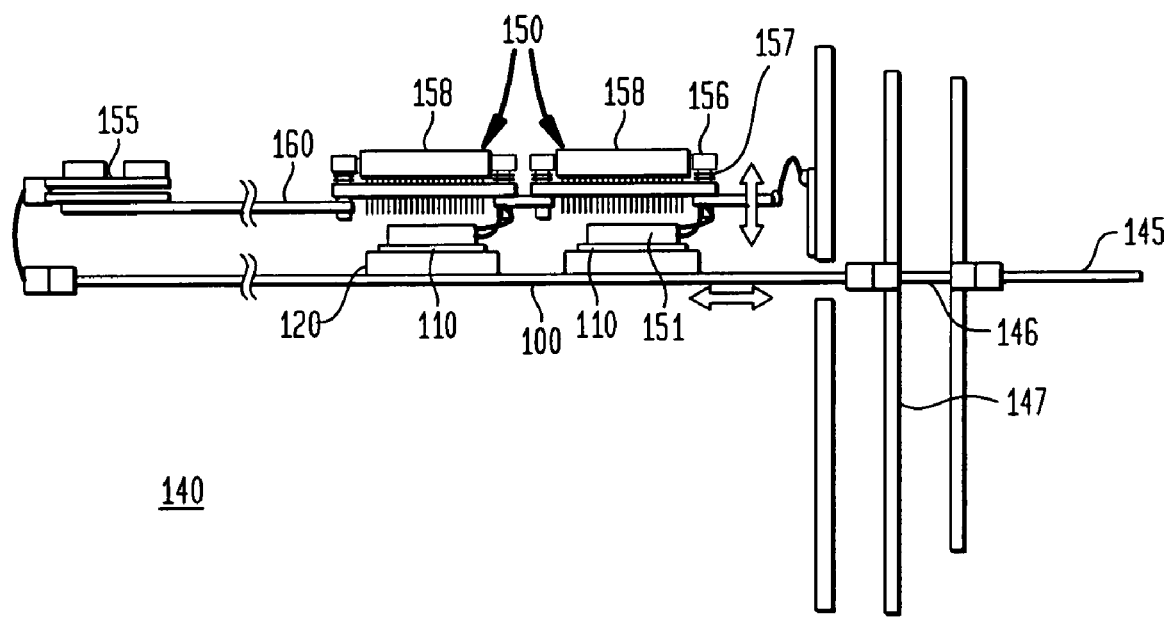
FIG. 13 is a schematic side view of DUTs loaded into a burn-in chamber and coupled to the thermal control unit of the present invention.

Referring to FIG. 13, a modified chamber 140 is illustrated. The modified chamber 140 accepts for testing DUTS 110 mounted on sockets 120 which are mounted on burn in boards 100. The DUTs 110 and sockets 120 are adapted so that TCU 150 can be placed in contact with DUTs 110. In particular, the chamber 140 has a plurality of TCU racks 160. The TCU rack 160 supports TCUs 150 and the TCU controller 155. The TCU rack 160 is movably mounted in the chamber 140 so that it can be raised and lowered. In its lowered position, the TCU rack 160 is located such that the copper block 151 of the TCU's 150 is in contact with the DUTs 110. In the embodiment illustrated in FIG. 13, the TCUs 150 are mounted to the TCU rack 160 using a floating mount 156 placed in contact with DUTs 110. The TCU's 150 are mounted by springs 157. Spring mounts 157 allow the TCUs 150 to tilt and therefore adjust in position to that of the DUT. This ensures maximum surface contact between the DUT 110 and the copper block 151 of the TCU 150. The pressure that each individual DUT will receive from the TCU depends upon the tension in the spring 157. It is advantageous if the pressure on the DUT is less than 6 kg/in$^2$.

FIG. 17A-C illustrates in detail the mechanisms that allow reliable contact between the TCU 150 and the DUT. For purposes of the illustration, the fan 158 of the TCU 150 is not illustrated. In FIG. 17A, the copper block 151 is illustrated as suspended above DUT 110 by the TCU rack 160. The copper block TCU 150 is affixed to the TCU rack 160 by the floating mount 156. Referring to FIG. 17B, the TCU rack 160 lowers the TCU 150 into such position that the copper block 151 is brought into contact with the DUT 110. Note that, as the TCU 150 contacts the DUT, the springs in the floating mount 156 are compressed which allows the TCU to urge the copper block 151 into firm contact with the DUT 110. This allows good contact to be achieved even if the TCU 150 is misaligned with the DUT 110. If this occurs, the floating mounts 156 simply allow the springs to compress to different degrees, allowing the TCU 150 to conform to the angle at which the DUT 110 is disposed in the socket 120 as shown in FIG. 17C.

Figure 14:
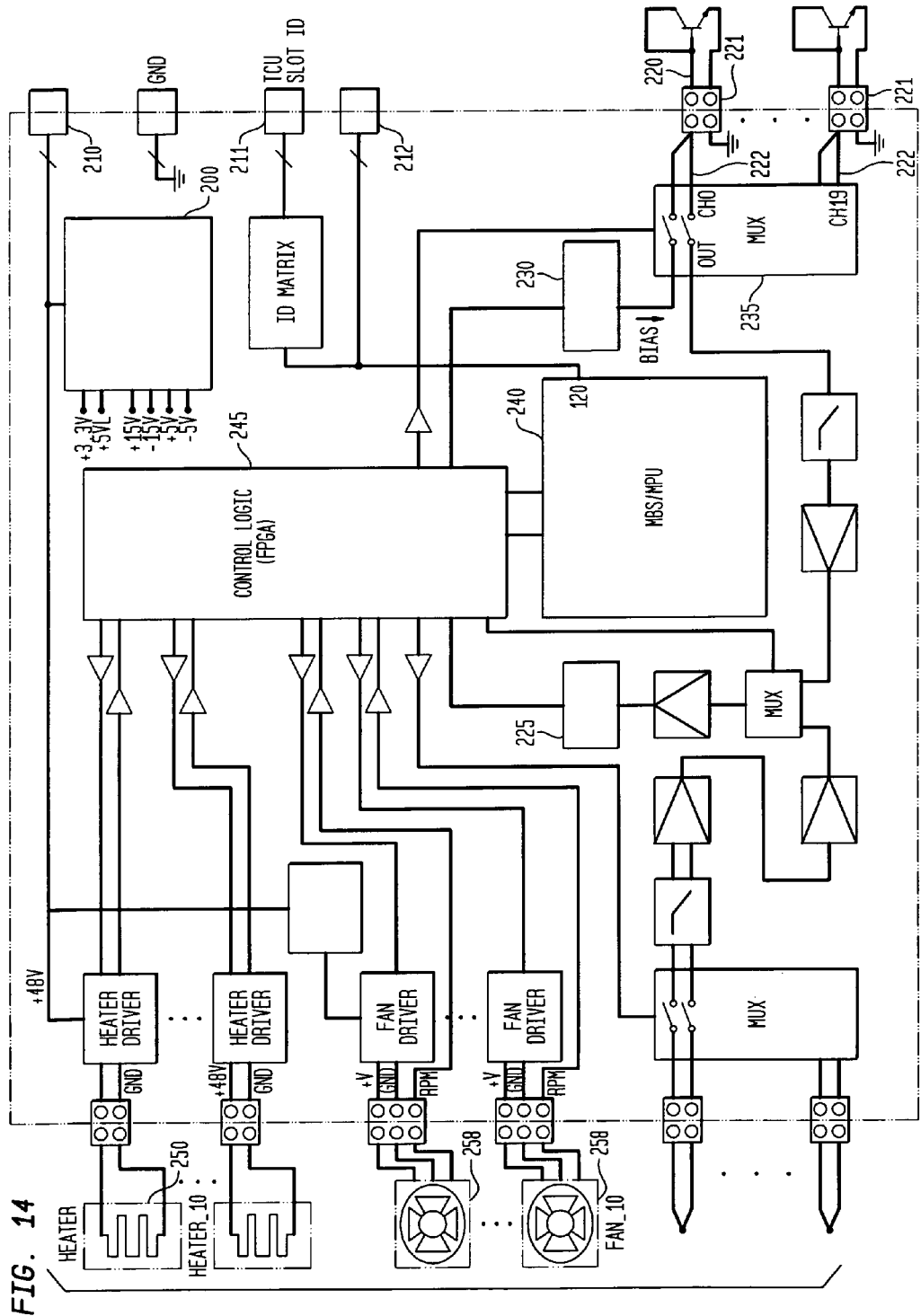
FIG. 14 is one embodiment of a circuit diagram for the thermal control unit for the present invention.

FIG. 14 illustrates one embodiment of a TCU controller 155 configuration. The TCU controller is illustrated as block 200. 210 and GND are the TCU power supply. The slot ID 211 assigns the slot identity to the data output to the controller. The slot identity indicates the specific TCU/DUT to which the data relates. The communication interface to the system controller is 212. In the illustrated embodiment, the controller block 200 is configured to control 20 individual TCUs simultaneously. The TCUs are not illustrated individually but illustrated by the first and last TCU in the sequence 00→19.

The controller 200 monitors the temperature of the DUT in contact with each TCU and controls the temperature of the heater and the fan in response to the measurement. The controller 200 compares the measured temperature with a threshold value and turns the heater and fan on or off as appropriate to achieve the desired adjustment in TCU temperature. In the illustrated embodiment, the controller 200 uses the diode voltage to control the TCU. The controller outputs 222 are connected to the terminals 220 of the DUTs 1-20 through diodes 221. Current source 230 and ADC 225 are connected to the diodes 221 selected by switches in the multiplexer 235. Specifically, a DUT is selected by connecting both the current source 230 and the ADC 225 to the DUT. When connected in this manner, constant current is supplied to the diode 221 of the selected DUT and the voltage of the DUT diode is converted to a digital signal by the ADC 225. The digital signal is output to the microprocessor unit (MPU) 240, which will determine the DUT temperature from the input value. The MPU then communicates with the logic controller 245, which controls the heater 250 and the fan 258 for the DUT in response to continued measurement of the temperature of the DUT. A measured temperature change either above or below a predetermined threshold will cause the logic controller to turn the heater 250 and fan 258 on or off as appropriate.

Figure 15:
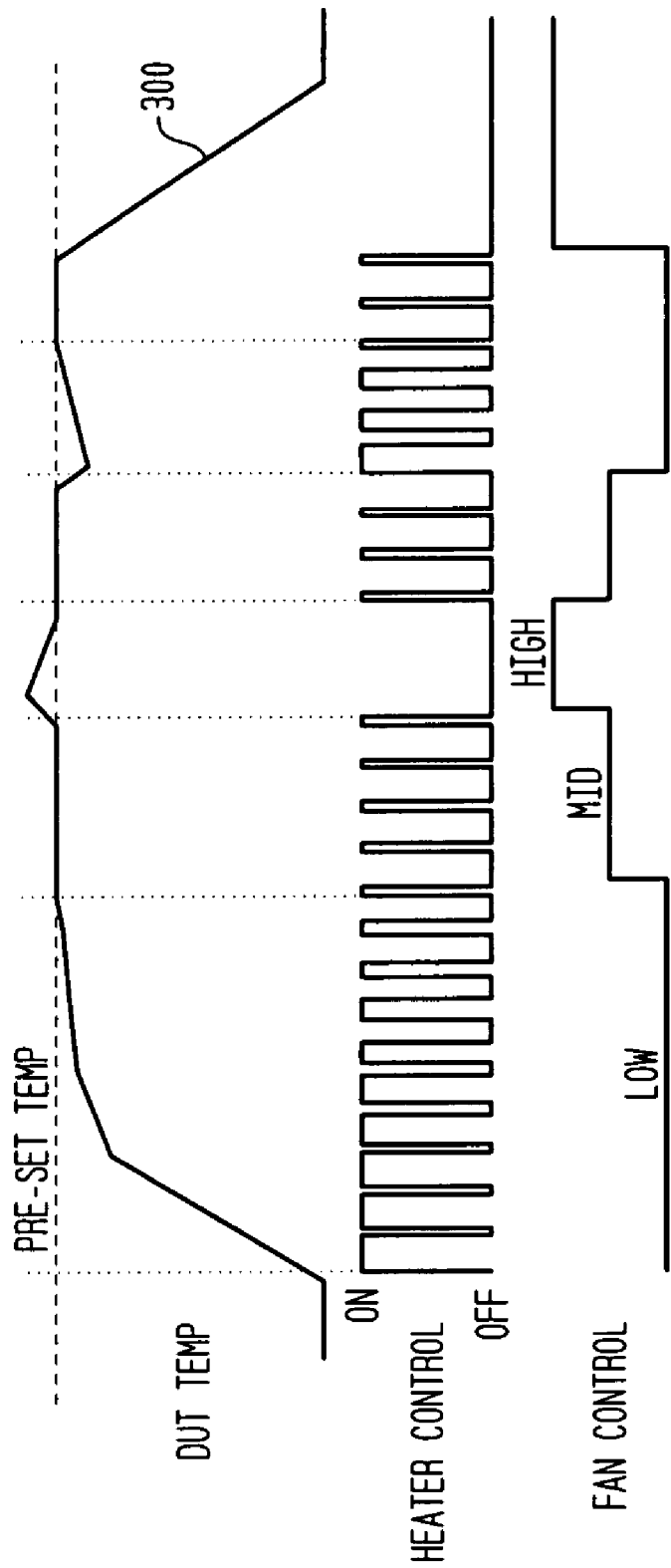
FIG. 15 is one embodiment illustrating how the heater and fan are operated by the controller.

FIG. 15 is a diagram that illustrates how the heater 250 and fan 255 are controlled. The top line 300 illustrates the temperature of the DUT as a function of time. Note that the initial temperature of the DUT is well below the pre-set temperature. In order to allow the temperature of the DUT to quickly increase to the pre-set temperature, the duty cycle of the heater (i.e. the ratio of the on cycle to the off cycle) is high. As the temperature increased to the pre-set temperature, the duty cycle decreases. When the temperature of the DUT is above the pre-set temperature, the duty cycle of the heater is zero (i.e. the heater is off). This continues until the end of the burn in process, where the heater is turned off and the DUT is allowed to cool.

As can be seen from FIG. 15, the fan is used for cooling. When the burn-in process starts, and the DUT is being heated, the cooling action of the fan is not needed and the fan is off. As the duty cycle decreases when the DUT is near the pre-set temperature, the fan turns on at medium speed in order to maintain the temperature of the DUT near the pre-set temperature. When the temperature of the DUT exceeds the present temperature, the speed of the fan will be increased to high speed to increase cooling capacity.

FIG. 16A-B illustrates the temperature of a dummy DUT during evaluation. The dummy device was a 40 W heater. The top line 310 illustrates the temperature of the dummy device and how the temperature is controlled. Excluding the temperature ramp up and cool down, the temperature of the DUT is maintained in the range of ± one degree of the preset temperature (130° C.).

In certain embodiments, the DUTs are high end processors that have thermal diodes embedded in the sides thereof. These thermal diodes measure the chip temperature using voltage between the ends of the diode in response to a constant current. A change in voltage corresponds to a change in temperature. That is, by measuring the voltage between two ends of the diode supplying constant current, the temperature of the chip is measured.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A thermal control unit comprising:
a heat transfer block;
a heat pipe that is a liquid-containing heat transfer component at least partially disposed in the heat transfer block, said liquid-containing heat transfer component having a proximate end and a distal end, said proximate end disposed in the heat transfer block;
a sensor that senses the temperature of a device under test when the heat transfer block is placed into contact with the device under test;
a heater positioned on the liquid-containing heat transfer component between the proximate and distal ends;
a thermal regulator that controls the heater in response to the sensor;
wherein the thermal regulator turns the heater on if the temperature of the device under test is below a threshold temperature and off if the temperature is at or above the threshold temperature.

2. The thermal control unit of claim 1 wherein the heat pipe has a plurality of fins at its distal end.

3. The thermal control unit of claim 2 wherein the heat pipe contains a reservoir of liquid at its distal end.

4. The thermal control unit of claim 3 wherein the liquid is an inert liquid.

5. The thermal control unit of claim 4 wherein the heat pipe has a passage along an inner heat pipe wall for channeling condensed vapor flowing from the proximate end to the distal end.

6. The thermal control unit of claim 5 wherein the passage is a plurality of lines or grooves in the surface of the heat pipe.

7. The thermal control unit of claim 2 wherein the heat pipe has a vertical component disposed between the proximate and distal ends.

8. The thermal control unit of claim 2 wherein the heater is placed on an exterior wall of the heat pipe.

9. The thermal control unit of claim 8 wherein the heater jackets the heat pipe.

10. The thermal control unit of claim 2 wherein the interior of the heat pipe has a textured surface of fine metal balls.

11. The thermal control unit of claim 2 wherein the interior of the heat pipe contains fine fibers to provide for capillary flow of the liquid in the heat pipe.

12. The thermal control unit of claim 1 wherein the heat transfer block is made of copper or aluminum.

13. The thermal control unit of claim 1 wherein the liquid containing heat transfer component is a plurality of heat pipes.

14. The thermal control unit of claim 1 further comprising a socket.

15. The thermal control unit of claim 14 wherein the socket is attached to a test board having a plurality of sockets, each of said plurality of sockets having a thermal control unit disposed therein.

16. The thermal control unit of claim 1 further comprising a clamping assembly.

17. The thermal control unit of claim 16 wherein the clamping assembly is a vacuum assembly.

18. The thermal control unit of claim 1 wherein the thermal regulator is a microcontroller.

19. The thermal control unit of claim 1 further comprising a fan controlled by the thermal regulator.

20. The thermal control unit of claim 8 wherein a graphite seat is disposed between the heater and the heat pipe.

21. The thermal control unit of claim 1 wherein the thermal control unit is supported by a rack via a rack mount.

22. The thermal control unit of claim 21 wherein the rack mount is a floating mount.

23. The thermal control unit of claim 22 wherein the floating mount comprises a plurality of springs.

* * * * *